US006643597B1

(12) United States Patent
Dunsmore

(10) Patent No.: US 6,643,597 B1
(45) Date of Patent: Nov. 4, 2003

(54) CALIBRATING A TEST SYSTEM USING UNKNOWN STANDARDS

(75) Inventor: Joel Dunsmore, Sebastopol, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 147 days.

(21) Appl. No.: 09/938,716

(22) Filed: Aug. 24, 2001

(51) Int. Cl.$^7$ .............................................. G06F 19/00
(52) U.S. Cl. ........................................ 702/104; 702/85
(58) Field of Search ................................ 342/165, 174; 455/67.1, 115, 226.1; 702/85, 90, 91, 103, 104, 108, 109, 120, 127, 182

(56) References Cited

U.S. PATENT DOCUMENTS

| | | | | |
|---|---|---|---|---|
| 5,097,215 A | * | 3/1992 | Eul et al. ..................... | 324/601 |
| 5,268,636 A | | 12/1993 | Phillips et al. ............... | 324/158 |
| 5,313,166 A | * | 5/1994 | Eul et al. ..................... | 324/601 |
| 5,442,296 A | * | 8/1995 | Schiek et al. ................. | 324/601 |
| 5,608,330 A | * | 3/1997 | Heuermann et al. ........ | 324/601 |
| 5,666,059 A | * | 9/1997 | Heuermann et al. ........ | 324/601 |
| 5,734,268 A | * | 3/1998 | Bockelman .................. | 324/601 |
| 5,748,506 A | * | 5/1998 | Bockelman ............ | 364/571.02 |
| 5,793,213 A | * | 8/1998 | Bockelman et al. ........ | 324/601 |
| 6,081,125 A | * | 6/2000 | Krekels et al. .............. | 324/601 |
| 6,300,775 B1 | * | 10/2001 | Peach et al. ................. | 324/601 |
| 6,480,795 B1 | * | 11/2002 | Bossart et al. ............... | 702/104 |

OTHER PUBLICATIONS

Krekels, H G; Schiek, B;"A Full Model Calibration Algorithm Fo A Dual Six–Port Network Analyzer"; IEEE Conference Proceedings Instrumentation and Measurement Technology Conference; 10$^{th}$ anniversary; vol. 2; May 1994; pp 990–993.*

Wei–Kung Deng; Tah–Hsiung Chu;"A Three–Port Vector Network Analyzer– Measurement System, Calibration And Results"; IEEE MTT–S International Microwave Symposium Digest; 2001; vol. 3; pp 1531–1534.*

Ning Hua Zhu; "Phase Uncertainty In Calibrating Microwave Test Fixtures"; IEEE Transactions on Microwave Theory and Techniques; vol. 47 Issue 10; Oct. 1999; pp 1917–1922.*

Keezer, D C; Wenzel, R J;"Calibration Techniques For A Gigahertz Test System"; International Test Conference Proceedings; Sep. 1992; pp 530–537.*

Dunsmore, J; "Measurement Uncertainties In Filter And Low–Loss Measurements"; Asia–Pacific Microwave Conference 2001; vol. 2; pp 898–901.*

Sequeira, H B; Trippe, M W; Jakhete, R;"A Network Analyzer Calibration Using Redundancy"; 18$^{th}$ European Microwave Conference Proceedings; Sep. 1988; pp 321–326.*

Dylan Williams, "De–embedding and Unterminating Microwave Fixtures with Nonlinear Least Squares," IEEE Trans. Microwave Theory Tech., vol. 38, No. 6, Jun. 1990, pp. 787–791.

* cited by examiner

Primary Examiner—John Barlow
Assistant Examiner—Douglas N Washburn

(57) ABSTRACT

A method and system for calibrating a test system and a vector network analyzer use models of unknown calibration standards for a standards-based calibration. The models are selected for the unknown standards and performance data for each different calibration standard of the set are measured by the test system. The performance data is used to optimize the models by adjusting element values of constituent elements of the models. The optimized models are used to calibrate the test system such that the test system corrects for any imperfections in performance measurements taken of a device under test measured by the calibrated test system. The present invention further can correct for affects of a test fixture in device under test measurements. The method can also determine calibration coefficients for unknown calibration standards by extracting the calibration coefficients from the optimized models.

55 Claims, 6 Drawing Sheets

CALIBRATING A TEST SYSTEM USING UNKNOWN STANDARDS

TECHNICAL FIELD

The invention relates to electronic test equipment. In particular, the present invention relates to calibration of electronic test equipment systems such as vector network analyzers.

BACKGROUND ART

Test systems are critical to the manufacture and maintenance of modem electronic devices and systems. A variety of test systems are routinely employed such as scalar and vector network analyzers, spectrum analyzers, and power meters. Most of these systems provide for calibrating the test system. The calibration process attempts to mitigate or remove the effects of the test system imperfections from the measurements of a device under test (DUT). Typically, calibration involves using the test system to measure the performance of so-called calibration standards having known performance characteristics. The results of these measurements are then used to extract and remove measurement errors associated with the imperfections of the test system. To better understand the concept of calibration with respect to test systems consider a network analyzer, its error sources, and the calibration process used to remove the effects of the error sources.

A network analyzer characterizes the performance of RF and microwave devices under test (DUT) in terms of network scattering parameters. Scattering parameters, more commonly called 'S-parameters', are reflection and transmission coefficients computed from measurements of voltage waves incident upon and reflected from a port or ports of a DUT. In general, S-parameters are given either in terms of a magnitude and phase or in an equivalent form as a complex number having a real part and an imaginary part. A network analyzer capable of measuring both the phase and magnitude of the S-parameters of the DUT is called a vector network analyzer.

A vector network analyzer exhibits random errors and systematic errors during the measurement of a DUT. Random errors are primarily due to system noise sources including phase and amplitude noise of the stimulation source, receiver noise, and sampler noise. Random errors vary randomly as a function of time and, in most cases, cannot be removed by calibration, but may be minimized by averaging repeated measurements. Systematic errors are repeatable, non-random errors associated with imperfections in or non-ideal performance of the network analyzer and test setup being used. Moreover, systematic errors either do not vary with time or vary only slowly with time. Therefore, the effect of systematic errors on measured S-parameter data for a DUT can be minimized or eliminated through the use of network analyzer calibration. Essentially, network analyzer calibration involves determining correction factors or coefficients associated with an error model for the measurement system. Once determined, the correction factors are used to mathematically remove the effect of the systematic errors from the measured S-parameters for the DUT.

Six types of errors account for the major systematic error terms associated with a vector network analyzer measurement of the S-parameters. The six systematic errors are directivity and crosstalk related to signal leakage, source and load impedance mismatches related to reflections, and frequency response errors caused by reflection and transmission tracking within test receivers of the network analyzer. For a general two-port DUT, there are six forward-error terms and six reverse-error terms (six terms for each of the two ports of the DUT), for a total of twelve error terms. Therefore, a full measurement calibration for a general two-port DUT is often referred to as a twelve-term error correction or calibration.

Calibration standards are typically used in a measurement calibration to measure and quantify the error terms. Once determined, the error terms are used to compute correction factors or correction terms for use in the network analyzer calibration. A calibration standard is a precision device for which the S-parameters are known with sufficiently high accuracy to accomplish the calibration. That is, the accuracy of the calibration is directly related to the accuracy of the knowledge of the S-parameters of the calibration standard.

The known S-parameters of the calibration standard are used to compute a set of calibration coefficients that are incorporated into the network analyzer error model. Then, by making measurements of several different known calibration standards with the network analyzer it is possible to develop and solve a set of linear equations for a set of correction factors. The correction factors in conjunction with the calibration coefficients allow corrected S-parameter data to be reported by the 'calibrated' network analyzer. In general, as long as there are more equations (i.e. measurements of known calibration standards) than there are unknown error terms in the error model, the correction factors associated with the error terms can be determined uniquely. For example in the case of a twelve-term correction for a two-port DUT, four calibration standards consisting of a short circuit ('short'), an open circuit ('open'), a load, and a through ('thru') can be used to completely and uniquely determine the correction factors associated with each of the terms of the twelve-term error model. The use of short, open, load and thru standards is referred to as a SOLT calibration set. Another example of a popular calibration model used to develop a twelve-term correction is a thru-reflect-line (TRL) calibration.

Unfortunately, it is not always convenient or even possible to construct a set of calibration standards, the S-parameters of which are known with sufficient accuracy over a frequency range of interest for calibration purposes. An example of a such situation where constructing known calibration standards is difficult is testing a DUT that must be mounted in a test fixture as opposed to being connected directly to a coaxial cable or cables attached to the network analyzer. In addition to the problem of constructing and measuring calibration standards for these so-called 'in-fixture' measurements, repeatability of the calibration can also be a concern since it may not be possible to insert calibration standards into the fixture in a manner that is sufficiently repeatable, leading to unaccounted for and thus uncalibrated errors in the measurements.

Accordingly, it would be advantageous to calibrate a test system without relying on using known calibration standards. Furthermore, it would be desirable for such a calibration to enable the testing of a DUT in a test fixture without concern for the repeatability of calibration standard insertion. Such a calibration would solve a long-standing need in the area of calibrated test systems using calibration standards.

SUMMARY OF THE INVENTION

The present invention is a method and system for calibrating test equipment using a standards-based calibration that facilitates accurate measurements, and a vector network analyzer employing a standards-based calibration. The present invention works well even when a test fixture is used with the test equipment, where the test fixture facilitates 'in-fixture' measurements on a device under test (DUT). The method of calibrating is a 'standards-based' calibration method in which a set of calibration standards, wherein at least one calibration standard of the set has an unknown performance, is used. The system and vector network analyzer of the present invention also are based on this standards-based calibration. The present invention utilizes measurements of calibration standards to correct imperfections in measurements of the DUT performance due to the test system. The present invention further can correct for the effects of the test fixture in DUT measurements. According to the present invention, simulation models of the unknown calibration standards are selected and actual measurements of the unknown calibration standards are used to extract parameter values for constituent elements of the models. Once the element parameter values are extracted, the parameterized models provide an accurate characterization of the performance of the calibration standards over a broad frequency range. The present invention is applicable to any standards-based calibration of test systems.

In one aspect of the present invention, a method of calibrating a test system for testing a device under test is provided. The method comprises the step of selecting respective models for a set of calibration standards. Each of the models defines a constituent element for which element values must be specified to fully characterize the associated calibration standard. A performance characteristic of at least one of the calibration standards is initially unknown making it an 'unknown' standard. The performance characteristics of the unknown calibration standards may be either completely unknown or just poorly known. Additionally, at least one of the element values for calibration standard models is initially unknown. The method further comprises the step of performing measurements using each of the calibration standards so that the measurements collectively are sufficient to determine the initially unknown element value. The method still further comprises the step of calibrating the test system as a function of the measurements. Each calibration standard is attached in turn to the test system for the measurements.

In one form, a test system Yes a test fixture in the step of performing measurements. In this embodiment, each calibration standard is attached turn to the test system via a test fixture for the measurements. The test fixture has an associated fixture model having an associated constituent element for which fixture element values must be specified to fully characterize the test fixture. At least one of the fixture element values is initially unknown. The measurements obtained in the performing step are sufficient to determine the initially unknown standard value as well as the unknown fixture value.

In another aspect of the invention, a method of calibrating a test system using a standards-based calibration is provided. The method of calibrating comprises the step of measuring performance data of a set of calibration standards using the test system over a broad frequency range, wherein at least one of the calibration standards in the set is an unknown standard. The method further comprises the step of selecting a computer model for the unknown calibration standard, wherein the model has a constituent element that has at least one unknown element value. The method of calibrating further comprises optimizing the computer model by adjusting the unknown element value of the constituent element. The adjustment is a function of simulated performance data for the model and the actual measured performance data for the unknown calibration standard. The adjustment is such that the simulated performance data of the unknown calibration standard model agrees with the respective actual measured performance data. The optimized model is used along with the measured performance data of the set of calibration standards to calibrate the test system.

In one embodiment, a test fixture is used by the test equipment for testing a device under test (DUT). The set of calibration standards are each in turn connected to the test fixture for performing measurements for different combinations of the test fixture and each calibration standard of the set in the step of measuring. In this embodiment, the step of selecting a computer model comprises further selecting a computer model for the test fixture, where the test fixture model has an associated constituent element with at least one unknown element value. Moreover, the step of optimizing further comprises optimizing the test fixture model by adjusting the element value of the associated constituent element of the test fixture model such that simulated data for the different combinations of the test fixture model and each calibration standard of the set agrees with the actual measured data.

Once optimized, the models can be used directly to generate an error array for correcting the measurement of a DUT. Alternatively, the test fixture may be de-embedded from the measurement and a calibrated measurement of the DUT performed. Moreover, the models of the test fixture and calibration standards can be separated from one another and used independently. In particular, once the optimized models of the calibration standards are available, the calibration standards can be used in the calibration of other test fixtures as 'known' standards using conventional calibration methods.

In another aspect of the invention, a method of determining a calibration coefficient for an unknown calibration standard from a set of calibration standards used for standards-based calibration of a test system is provided. The set of calibration standards used has at least one unknown calibration standard. Advantageously, the method of determining a calibration coefficient of the present invention may use unknown calibration standards that are adapted for use in a test fixture. The method of determining does not rely on the use of precision calibration standards with accurately known performance characteristics.

The method of determining calibration coefficients comprises the step of selecting a computer model for the unknown calibration standard, where the calibration standard model has a constituent element with at least one unknown element value. The method of determining further comprises the step of measuring performance data of each calibration standard of the set over or within a broad frequency range. The method of determining further comprises the step of optimizing the computer model of the unknown calibration standard by adjusting the unknown element value of the constituent element until simulated data for the unknown calibration standard agrees with respective measured performance data. The method of determining further comprises the step of extracting a calibration coefficient for the unknown standard from the optimized model of the unknown standard.

Preferably, prior to the application of the method of calibrating and the method of determining calibration coefficients of the present invention, a calibration of the test system is performed using conventional known calibration standards and according to procedures provided by the manufacturer of the test system. This conventional calibration, while not necessary, improves the results of the method of calibrating and the method of determining calibration coefficients of the present invention by mitigating the effects of measurement errors associated with the test system and cabling between the test system and any test fixture.

In another aspect of the invention, a system for calibrating test equipment using a standards-based calibration is provided. The system comprises a set of calibration standards, where at least one standard of the set is an unknown calibration standard. Each calibration standard of the set is temporarily interfaced to the test equipment for respective measurements. The system further comprises a computer or other processor/controller interfaced with the test equipment. The computer implements a computer program that provides a modeling environment and a model optimization. The modeling environment comprises a computer model for each unknown calibration standard of the set and simulated data for each model. The model optimization comprises an optimized model for each of the computer models. Each of the optimized models is a function of the respective measurements and the simulated data for the respective model. The system may further comprise the test equipment, and the test equipment may further comprise a test fixture to which each calibration standard of the set in turn is attached for measurements.

The system for calibrating is applicable to any test equipment that utilizes a standards-based calibration. In particular, the system for calibrating is applicable to scalar network analyzers, vector network analyzers (VNAs), impedance analyzers, power meters, and spectrum analyzers. The system employs the method of calibrating of the present invention.

In yet another aspect of the present invention, a vector network analyzer having a standards-based calibration using a set of calibration standards where at least one standard is unknown is provided. The vector network analyzer comprises a vector network analyzer portion having an analyzer port, and a controller that controls the operation of the analyzer portion. The controller implements a calibration computer program that comprises a modeling environment and a model optimization. The modeling environment comprises a computer model for each unknown calibration standard of the set of calibration standards, and simulated data for each of the computer models. The model optimization comprises an optimized model for each of the computer models. Each optimized model comprises an adjustment that is a function of the simulated data for the respective model and actual measurement data of the respective unknown calibration standard taken by the analyzer portion at the analyzer port.

Unexpectedly and advantageously, the calibration method, system and vector network analyzer of the present invention do not require the use of precision calibration standards having accurately known characteristics or parameters, as do conventional standards-based calibrations. Instead the method may use a set of so-called 'unknown' calibration standards, calibration standards having unknown or poorly known parameters. Thus, lower cost standards may be used for calibration according to the present invention. Moreover, since unknown standards may be used, the accuracy and ease of performing calibration for in-fixture measurements is greatly enhanced by the present invention. In addition, parameterized models of the test fixture and the unknown calibration standards, once developed, can be used independently of each other in subsequent calibrations according to the present invention. While the methods and system are described in detail with respect to 'in-fixture' measurements below, the test fixture may be an actual test fixture, a simple fixture such as a connector adaptor, or even a null fixture (i.e. a fixture with no loss, no parasitics, and no electrical length). As such, where the test fixture is essentially a null fixture, the methods can produce and the system and the analyzer each can use models of just the unknown calibration standards. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

Figure 1:
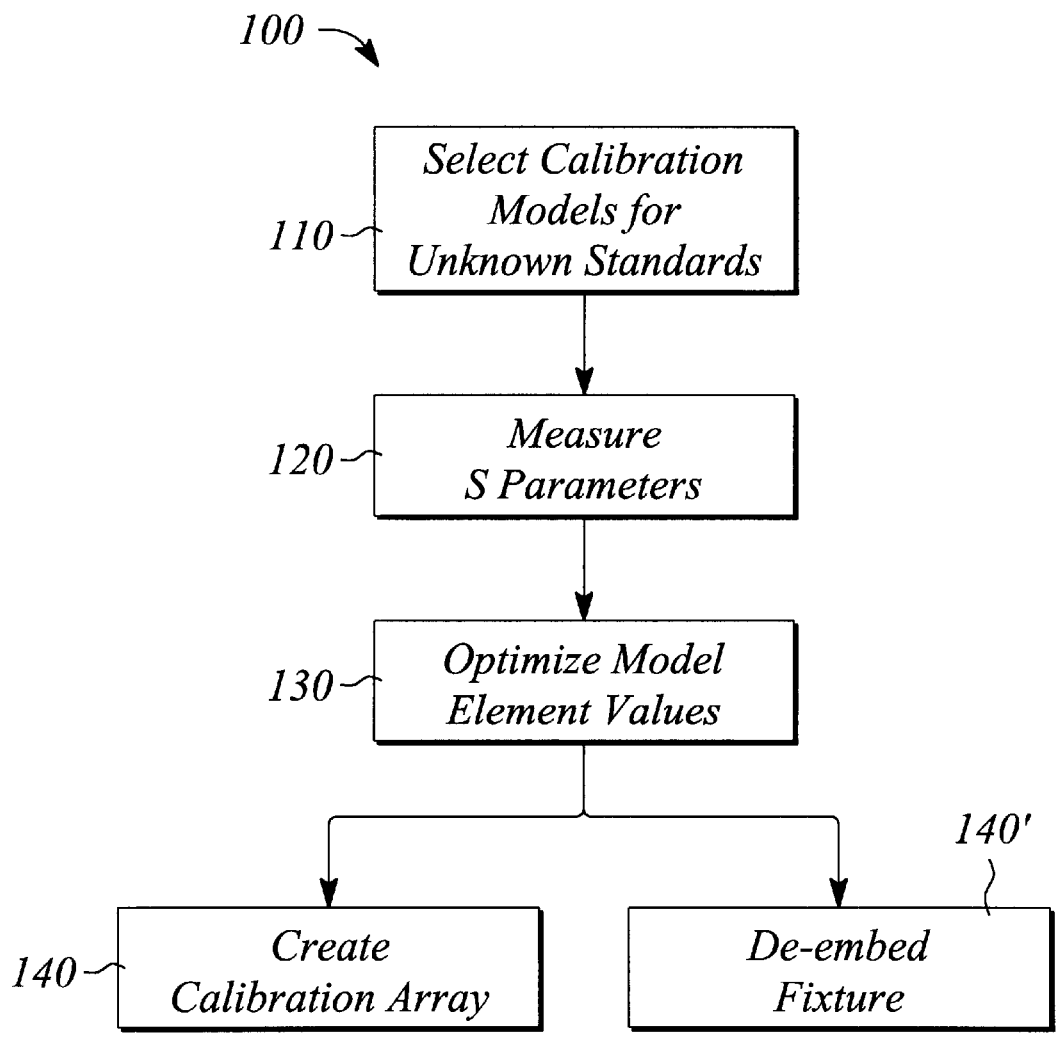
FIG. 1 illustrates a flow chart of a method of calibrating a test equipment according to a preferred embodiment of the present invention.

The present invention is a method and system for calibrating test equipment that utilizes calibration standards having unknown or poorly known performance characteristics. According to the present invention, measurements of these unknown calibration standards are used to affect the calibration of the test equipment. The method and system for calibrating are applicable to any standards-based calibration appropriate for a given test equipment or system. The method and system calibrate test equipment used for testing a device under test (DUT). In particular, the method and system of the present invention are well suited for performing standards-based calibration of test equipment or test systems that employ 'in-fixture' testing of the DUT. Test equipment or test systems to which the method and system are applicable include, but are not limited to, scalar network analyzers, vector network analyzers (VNAs), impedance analyzers, power meters, and spectrum analyzers.

For purposes of discussion hereinbelow, the test equipment will be a vector network analyzer that measures S-parameters of the DUT. Thus, the method and system of calibrating when applied to a VNA is applicable to any standards-based calibration appropriate for VNAs including, but not limited to, short-open-load-thru (SOLT), thru-reflect-line (TRL), and line-reflect-match (LRM) calibrations. The test equipment is represented herein by the vector network analyzer solely for the purposes of facilitating discussion and is not intended to limit the scope of the present invention in any way. One of ordinary skill in the art can readily extend the discussion of calibrating VNAs to standards-based calibration of other test systems without undue experimentation.

The term 'in-fixture testing' as used herein refers to a testing a DUT while the DUT is mounted in a test fixture. In general, the test fixture serves two principal roles: adapting a standard interface of the VNA to that of the DUT, and physically/electrically mimicking the mounting environment of the DUT. The test fixture can be as simple or as complex as is required by the test being performed on the DUT. For example, a typical standard interface for the VNA is a set of coaxial cables having one of several standardized connector types on terminating ends. The test fixture can serve as a transition or adaptor between the standardized connectors of the coaxial cables and a non-standard DUT interface (e.g. solder pin or tab). In other situations, the test fixture may provide mounting and power connections as well as serve as an interface adaptor for a DUT lacking standardized connectors.

Alternatively, the test fixture may be simply a connector on the end of a cable or a connector adaptor that adapts one connector type to another in a case where the DUT has standardized connectors. The test fixture may even be a null fixture having zero loss, zero electrical length and no parasitics. One skilled in the art is familiar with test fixtures and their use in conjunction with testing DUTs.

As used herein, an 'unknown' or 'poorly known' calibration standard is one for which the performance parameters and/or a corresponding set of calibration standard coefficients are either completely unknown or are not known with sufficient accuracy over a frequency range of interest to perform the desired calibration using conventional calibration methods. Preferably, although not necessarily, the unknown standard should approximate one type of a known standard used in a conventional standards-based calibration. In the case of using a VNA as the test equipment, the usual performance parameters are S-parameters. An operational range of the DUT typically defines the frequency range of interest. The calibration method of the present invention may include a broader frequency range than the frequency range of interest for the DUT to provide desired or adequate calibration. One of ordinary skill in the art can readily determine a frequency range for the method of calibration of the present invention given a frequency range of interest of the DUT without undue experimentation.

FIG. 1 illustrates a flow chart of the method of calibrating test equipment for in-fixture testing of a DUT, according to a preferred embodiment of the present invention using a VNA as the test equipment. The method of calibrating 100 comprises the step of selecting 110 a computer model of each unknown calibration standard and a model of a test fixture. Herein, it is preferably assumed that the test fixture is a passive, 'linear' two-port network, the performance of which can be adequately represented by a 'linear' two-port model. Likewise, it is preferably assumed that the calibration standards are 'linear' devices, the performances of which can be adequately modeled by either 'linear' two-port models or 'linear' one-port models. One skilled in the art recognizes that the term 'linear', as used herein, includes 'approximately linear', as is well known in the art of linear devices.

The computer models of the test fixture and calibrations standards can be in any of a number of forms well known to one skilled in the art. Preferably, the models are based on mathematical representations of physical elements. Generally, the models may include elements representing discrete components such as resistors, capacitors, and inductors as well as elements representing distributed structures, such as models of transmission lines. While any reasonable model can be used, it is preferable that the models are comprised of elements based as much as possible on known physical characteristics of the test fixture and calibration standards. For example, if the test fixture comprises a length of transmission line, it is preferable that the model of the test fixture also has an element corresponding to a length of transmission line. However as an alternative, models that are simply mathematical formulas having adjustable coefficients can be used instead of models based on representations of physical elements. One skilled in the art is familiar with the equivalence between computer models based on mathematical formula and computer models employing, mathematical representations of elements.

In addition to selecting models that are based on the known physical characteristics of the test fixture and calibration standards, it is preferable that the selected models use as few elements as possible to adequately represent the likely performance of the physical test fixture or calibration standard over a desired frequency range. While an arbitrarily complex model can be used, one skilled in the art will readily appreciate that having fewer elements will facilitate the determination of element values in a later step of the method. Furthermore, specifics of the models are generally selected 110 to be compatible in a particular modeling environment or modeling computer program to facilitate computation of the performance characteristics of the model. Given a particular set of calibration standards, knowledge of the physical make-up of the test fixture, and of a particular modeling environment, one skilled in the art can readily select an appropriate model for the test fixture and appropriate models for the calibration standards, respectively, without undue experimentation.

Implicit in the step of selecting 110 are a determination of what type of calibration is to be performed and a choice of a set of calibration standards to be used. The choice of calibration standards is based on conventional guidelines for choosing standards. Conventional guidelines include choosing standards that have S-parameters that are widely spaced apart from each other in the complex S-parameter plane. Often, the determination of calibration type (e.g. SOLT) is dictated by the particular network analyzer being used. Likewise, the calibration type generally implies the choice of calibration standards (e.g. SOLT implies the use of a short, open, load and thru). A discussion of standards, SOLT and TRL calibration methods and conventional in-fixture calibration are provided in Agilent application notes AN1287-3, *Applying Error Correction to Network Analyzer Measurements*, PN 8510-5A, *Specifying Calibration Standards for the Agilent 8510 Network Analyzer*, and AN 1287-9, *In-Fixture Measurement Using Vector Network Analyzers*, all three of which are incorporated herein by reference.

By way of example, consider a printed circuit test fixture 200 representing an input portion of the test fixture for testing a DUT comprising an SMA connector 202, a transition region 204, a piece of transmission line 206, and a contact area 208 adapted for receiving a DUT connection lead. An example test fixture 200 is illustrated in FIG. 2A as a substrate 201 having a microstrip transmission line 206 fabricated on a top surface $201_A$ and a ground plane on a bottom surface $201_B$.

Figure 2A:
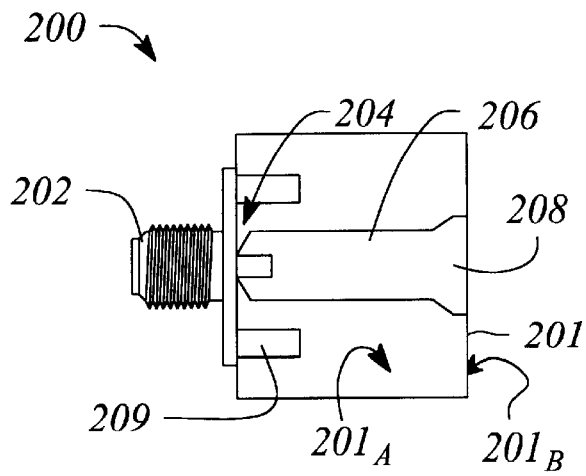
FIG. 2A illustrates an example of a test fixture.
Figure 2B:
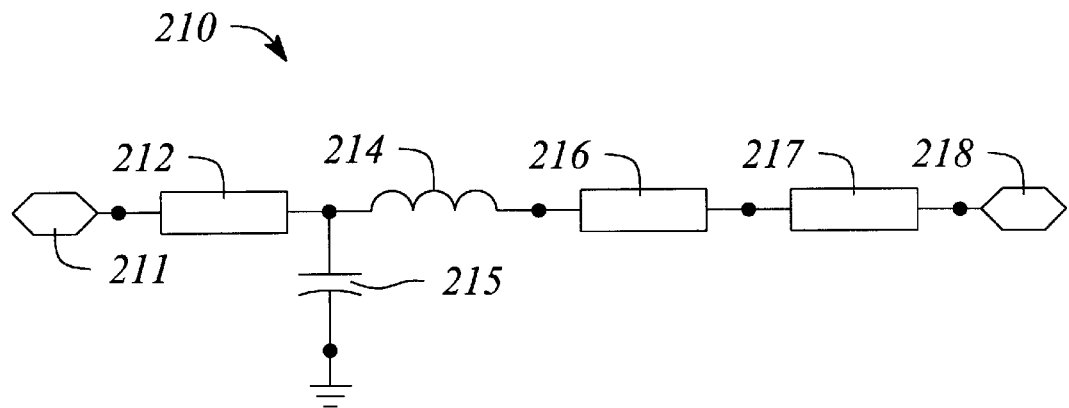
FIG. 2B illustrates a schematic block diagram of a model of the test fixture illustrated in FIG. 2A.

For the example illustrated in FIG. 2A, one skilled in the art might reasonably select 110 a model 210 of the test fixture 200 illustrated in FIG. 2B. The model 210 comprises an input port 211 connected to an input end of a model of a coaxial transmission line 212 having a length and an impedance. The coaxial transmission line 212 model represents or models the SMA connector 202.

The model 210 further comprises a series inductance 214 and a shunt capacitance 215 connected to an output end of the coaxial transmission line 212 model. The inductance 214 and capacitance 215 are modeled as a lumped inductor 214 and a lumped capacitor 215, respectively each having input ends connected to the output end of the coaxial transmission line model 212. An output end of the capacitor 214 is connected to ground potential. Together, the series inductance 214 and shunt capacitance 215 serve to represent the transition region 204 of the test fixture 200.

An output end of the inductor 214 is connected to an input end of a model of a first section 216 of transmission line, an output end of which is connected to an input end of a model of a second section 217 of transmission line. Together the models of the first and second sections 216, 217 of transmission line represent the piece of transmission line 206 of the test fixture 200. Preferably, the first and second sections 216, 217 of transmission line models are consistent with the type or types of transmission line 206 used in the test fixture 200. For example, if a microstrip line is used as illustrated in FIG. 2A, a model of a microstrip line is preferably used for the first and second sections 216, 217 of transmission line in the model 210. Alternatively, if a coplanar transmission line (not illustrated) is used in the test fixture 200, then a model of a coplanar transmission line is used for the first and second sections 216, 217. The length of transmission line 206 is modeled as the concatenated transmission lines 216, 217 to account for the SMA connector 202 grounding tabs 209 located on either side of the transmission line 206 that are known to affect the impedance Z of the transmission line 206. An output end of the second section 217 of transmission line is connected to an output port 218 representing the contact area 208.

The model 210 illustrated in FIG. 2B is only one possible model 210 representation for the test fixture 200 structure illustrated in FIG. 2A. The model 210 illustrated in FIG. 2B is provided herein for illustrative purposes only and is not intended to limit the scope of the present invention. Advantageously, the present invention is applicable to alternative test fixtures and models therefor. Alternative models for the test fixture 200 structure illustrated in FIG. 2A as well as alternative test fixture structures could be readily selected by one skilled in the art without undue experimentation and be within the scope of the present invention.

Continuing with the example, if an SOLT calibration is to be performed according to the present invention with the test fixture 200 illustrated in FIG. 2A, a set of calibration standards representing a short circuit, an open circuit, a load, and a through connection is needed. Unlike the conventional SOLT calibration, the physical calibration standards for the method 100 of the present invention need only approximate the ideal, precision standards normally employed with SOLT. For purposes of discussion, a short circuit calibration standard will be referred to hereinbelow as a 'short', an open circuit calibration standard will be referred to hereinbelow as an 'open', a load circuit calibration standard will be referred to hereinbelow as a 'load', and a through connection will be referred to hereinbelow as a 'thru'. As with the test fixture 200, a model is selected 110 for each of the calibration standards employed. Examples of a model of a short, an open, a load, and a thru calibration standard are illustrated in FIGS. 3A, 3B, 3C, and 3D, respectively.

As one of ordinary skill in the art would readily recognize, the physical or actual calibration standard representing a short circuit can be constructed from a piece of transmission line by 'shorting' or connecting an output of the transmission line to a ground potential. For example, the short can be constructed from a section of microstrip line fabricated on a substrate with an input end adapted for attachment to the test fixture 200 at the contact area 208 and the output end connected to a ground plane on an under side of the substrate by placing electrically conductive vias or through holes through the substrate at an output end of the microstrip line. Preferably, during construction of the physical short, the choice of transmission line type (e.g. microstrip, stripline, coplanar waveguide, etc.) is based on the type of transmission line being used in the test fixture 200, in part to facilitate interconnection between the short and the test fixture 200. Alternatively, the choice of transmission line type can be based on a connection port of a DUT to be tested using the test fixture 200 once it is calibrated.

Figure 3A:
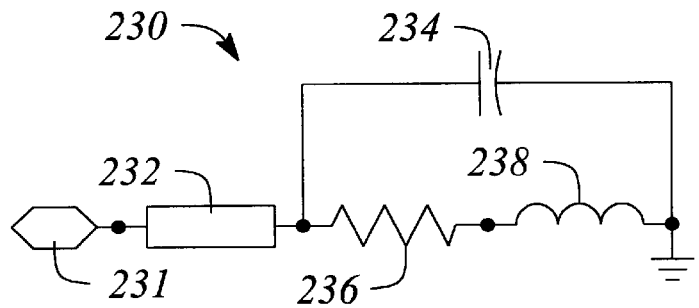
FIG. 3A illustrates a schematic block diagram of a model of a short calibration standard.

Referring to FIG. 3A, the model of the short 230 that reasonably might be selected 110 by one skilled in the art according to method 100 of the present invention to model the physical short comprises an input port 231 connected to an input end of a model of a transmission line 232. The transmission line 232 model has a length and an impedance. Preferably, the transmission line model 232 is consistent with the transmission line type used in the physical short. For example, if a microstrip transmission line is used in the physical short, preferably a microstrip model should be used in the transmission line model 232.

The short model 230 further comprises a shunt RLC circuit connected between an output end of the transmission line 232 and a ground potential. The RLC circuit comprises a shunt capacitance 234 and a series combination of a small resistance 236 and a small inductance 238 in parallel with the shunt capacitance 234. The small resistance 236 models ohmic loss while the capacitance 234 and inductance 238 account for stray capacitances and inductances associated with the short circuit connection (e.g. vias through the substrate) that can lead to a first order resonance. The capacitance 234, resistance 236 and inductance 238 are modeled as a lumped capacitor 234, a lumped resistor 236, and a lumped inductor 238, respectively. An input of the capacitor 234 and an input of the resistor 236 are connected to the output end of the transmission line 232. An output end of the resistor 236 is connected to an input end of the inductor 238. An output end of the capacitor 234 and the inductor 238 are connected to the ground potential. Generally, the values of the capacitance 234, resistance 236 and inductance 238 are all expected to be small but finite in the case of a short for use in the method 100 of the present invention.

A piece transmission line with an open circuited output end can be used as an open calibration standard. For example, a section of microstrip transmission line can be fabricated on a substrate with an input end adapted for attachment to the test fixture 200 at the contact area 208 and the output end that is open circuited.

Figure 3B:
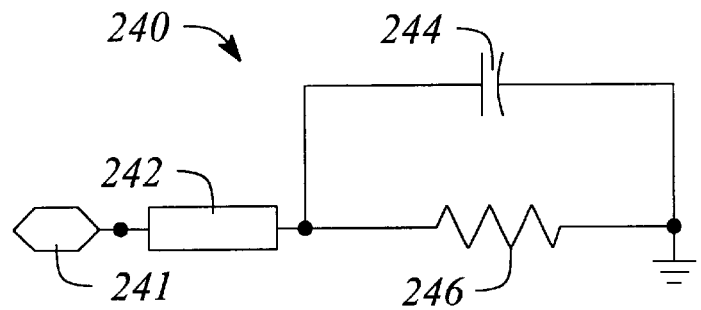
FIG. 3B illustrates a schematic block diagram of a model of an open calibration standard.

Referring to FIG. 3B, the open model 240 that might reasonably be selected 110 by one skilled in the art according to method 100 of the present invention to model the physical open comprises an input port 241 attached to an input end a model of a transmission line 242. An output end of the transmission line 242 model is connected to a shunt capacitance 244 in parallel with a shunt resistance 246. Again, preferably the transmission line 242 model should be consistent with the transmission line type used for the physical open.

The shunt capacitance 244 is modeled in the open model 240 as a lumped capacitor 244, an input of which is connected to the output of the transmission line 242 and an output of which is connected to the ground potential. The shunt resistance 246 is likewise modeled as a lumped resistor 246, an input of which is connected to the output of the transmission line 242 and an output of which is connected to the ground potential. The shunt capacitance 244 models fringing capacitance associated with the open circuit end of the transmission line of the physical open while the shunt resistance 246 models electromagnetic radiation loss associated with the open circuit end of the transmission line of the physical open. Generally, the shunt capacitance 244 is expected to have a small value while the shunt resistance 246 is expected to have a relatively large value. The shunt capacitance can have a more complex model, such as a capacitance value that varies with frequency. For example, a model for the open used in association with a standard VNA calibration kit, typically consists of a short length of line followed by a capacitance. Moreover, the capacitance value in the model is represented by a third order polynomial such that the capacitance varies as a function of frequency.

A physical load calibration standard can be constructed from a shunt resistor or resistors. Preferably, the resistance of the resistor is chosen to be close to an intrinsic impedance of the transmission line 206 of the test fixture 200 thereby resulting in a 'matched' or nearly matched load. For example, if the test fixture 200 employs a transmission line 206 having a 50 ohm impedance, the physical load can be constructed using a 50 ohm resistor connecting the output end of the transmission line to a ground potential.

Figure 3C:
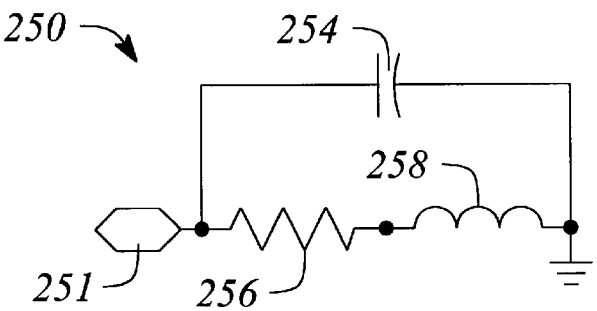
FIG. 3C illustrates a schematic block diagram of a model of a load calibration standard.

Referring to FIG. 3C, the load model 250 that might reasonably be selected 110 by one skilled in the art according to method 100 of the present invention to model the physical load comprises an input port 251 connected to an RLC circuit having a shunt capacitance 254 and a series combination of a resistance 256 and a small inductance 258 in parallel with the shunt capacitance 254. The capacitance 254, resistance 256 and inductance 258 are modeled as a lumped capacitor 254, a lumped resistor 256, and a lumped inductor 258, respectively. An input of the capacitor 254 and an input of the resistor 236 are connected to the input port 251. An output end of the resistor 256 is connected to an input end of the inductor 258. An output ends of the capacitor 256 and of the inductor 258 are connected to the ground potential. The shunt capacitance 254 and series inductance 258 account for a first order resonance of the physical load while the resistance 256 approximates the resistance of the physical load.

Figure 3D:
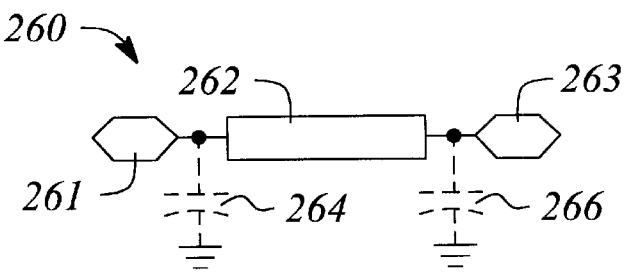
FIG. 3D illustrates a schematic block diagram of a model of a thru calibration standard.

Finally, a piece of transmission line can be used as a thru for the example of the SOLT calibration according to the method 100 of the present invention. Referring to FIG. 3D, the thru model 260 that might reasonably be selected 110 by one skilled in the art according to method 100 of the present invention to model the physical thru comprises an input port 261 connected to an input end of a model of a transmission line 262. An output end of the transmission line 262 is connected to an output port 263. In some cases, optional shunt capacitances 264, 266 can be included in the model 260. The optional shunt capacitances 264, 266 model stray fringing capacitances associated with the connection between the thru line and the test fixture 200. In FIG. 3D, the optional capacitances 264, 266 are illustrated using dashed lines.

During an SOLT calibration, the physical thru is connected between an input portion of a test fixture and an output portion of a test fixture. For simplicity in this example, it is assumed that the models 210 for the input and output portions of the test fixture are identical. For example, the test fixture 200 illustrated in FIG. 2A and the corresponding model 210 illustrated in FIG. 2B could be used as both the input portion and the output portion of the test fixture. Of course, this need not be the case. If the output portion of the test fixture differs from the input portion, a separate model is selected 110 for each of the input portion and output portion, respectively. Importantly, while the structures of the input and output models 210 are the same in this example, the specific values for the constituent elements of the input and output models 210 may be different for the models 210 representing the input and output ports, respectively.

The method of calibrating 100 further comprises the step of measuring 120 the S-parameters of the test fixture and calibration standards. A separate set of measurements is made for the test fixture having each of the calibration standards connected thereto. The measurements that are made for each fixture/standard combination are those consistent with the standard. Thus, a separate measurement of reflection S11 is made for the short connected to the input portion of test fixture, the open connected to the input portion of the test fixture, and the load connected to the input portion of the test fixture. The measurements are repeated for the output portion of the test fixture. The thru is connected between the input and output portions of the test fixture and a seventh set of measurements are performed. The measurements are taken for each standard at a relatively large number of frequency points within the frequency range of interest. An individual or independent measurement comprises measuring an S-parameter at a single frequency point.

One skilled in the art can readily determine a suitable number of frequency points to sufficiently determine the element values without undue experimentation. However, a number of frequency points (i.e. measurements) greater than the total number of elements to be optimized, divided by the number of independent measurements is preferable and considered to be sufficient in most instances. The goal is to have more measurements than there are unknown element values in the models. Having more measurements than there are unknown element values is often referred to as 'over-determining' the problem of finding element values. There are enough measurements such that the measurements collectively are sufficient to determine the initially unknown element value when the problem is over-determined.

In addition, the frequency points are preferably chosen such that the span of frequencies correspond to less than a significant portion of a wavelength of the electrically shortest distributed element, and the frequency point spacing corresponds to greater than a significant portion of a wavelength of the sum of the electrically longest elements. Choosing frequency points in this way helps to insure that the measurements adequately reflect a range of possible performance of the various elements in the model. One skilled in the art will recognize that such frequency spacing guidelines are similar to a preferred frequency spacing for performing a time domain measurement (i.e. using an inverse Fourier transform of the frequency data) and provide a resolution of the time domain measurement sufficient to resolve a shortest element and a range of the time domain measurement sufficient to resolve a longest element.

The method of calibrating 100 further comprises the step of optimizing 130 element values of constituent elements of the models. The step of optimizing 130 comprises the step of simulating the S-parameter performance of the test fixture in combination with each of the calibration standards using the models. The models are simulated in combinations that mimic those used in the step of measuring 120. The step of simulating produces simulated or modeled S-parameter data of the respective model combinations. The step of optimizing 130 further comprises the step of comparing the simulated S-parameter performance data of the models to the measured S-parameter performance data for the physical test fixtures and calibration standards. A metric is used to gauge the differences between the simulated data and the measured data in the step of comparing. The step of optimizing 130 further comprises the step of adjusting the element values of the elements that make up each model. The step of adjustment employs an optimization methodology. With each adjustment, the modeled S-parameter data is again compared to the measured S-parameter data from the step of measuring 120. When the difference between the measured and modeled S-parameter data is smaller than a predetermined value given by the predefined metric, the optimization is halted and considered to be finished.

Essentially, the goal of the step of optimizing 130 is to make the simulated or modeled S-parameter data of the models agree with or match the measured S-parameters of the physical test fixture in combination with the calibration standards.

Preferably, a simulation/optimization is performed in the step of optimizing 130 that accommodates simultaneous simulation and optimization of the test fixture in combination with all of the calibration standards. Thus for an SOLT, the simulation/optimization of the step of optimizing 130 accommodates simultaneous simulation and optimization of the test fixture with the open, the test fixture with the short, the test fixture with the load, and both the input and output portions of the test fixture with the thru. The simultaneous simulation/optimization should account for connection of the standards to both the input port and output port of the test fixture. The values of the elements of the input port fixture are constrained to be the same for each model representing each standard measurement. Likewise, the values of the elements of the output port fixture are constrained to be the same for each model representing each standard measurement. This results in an optimization that yields fixture elements that minimize errors between simulation and measurement for all standard measurements.

The step of optimization 130 utilizes a metric to gauge a quality of agreement or match between the S-parameter data from the model simulations and the measured S-parameter data of the various combined test fixture and calibration standards. One example of such a metric is the sum of the square of the difference between the measured and modeled S-parameter data at a number of frequency points within the frequency range of interest. The optimization goal in the 'sum of the squares' case is the minimization of the metric. The sum of the square of the differences metric is sometime referred to as a 'least squares' metric.

Another example approach to choosing a metric comprises setting the optimization goal differently for different ones of the S-parameters, or even for different ones of the standards and different ones of the S-parameters. Preferably, a strongest emphasis is placed on a desired attribute of each standard during optimization. For example, a desired attribute for the load and thru is that the reflection S-parameters, namely S11 and S22, ideally be small. A useful metric then is the difference, or more precisely a magnitude of the difference, between the measured and modeled results for S11 and S22 of the load and thru standards. The metric is minimized during optimization. On the other hand, some of the parameters such as the reflection S-parameters S11 and S22 of the open and short standards or the transmission S-parameters S21 and S12 of the thru standard are ideally equal to one. A better metric in these cases is obtained by taking a ratio of the measured and modeled results. The difference between the metric and unity is minimized during the optimization when using the ratio. One skilled in the art can readily devise many other appropriate metrics, some for which the optimization goal represents a minimization and others for which the optimization goal represents a maximization. All such metrics are within the scope of the present invention.

The S-parameter data for the various model combinations are readily computed through a modeled based simulation using a general-purpose microwave and/or RF modeling computer aided design (CAD) tool. As noted hereinabove, the only requirement for the modeling tool is that it be able to handle all of the elements included in the models of the step of selecting 110. Many general purpose microwave/RF CAD tools are readily available in the form of software or computer programs, including but not limited to Agilent/EEsof Advanced Design System (ADS) manufactured by Agilent Technologies, Inc., Palo Alto, Calif. and SuperCompact, manufactured by Compact Engineering, Inc. of Paterson, N.J. Alternatively, the S-parameter data can be computed by hand from the models using formulas readily available in most textbooks covering RF and microwave circuit analysis and design.

Any of a number of optimization methodologies can be employed in the step of optimizing 130 including, but not limited to, so-called random step, conjugate gradient, Powel's method, and genetic algorithm optimization. The choice of a specific optimization method is largely dependent on the metric being used and on the availability of a suitable implementation of the optimization method. Several of the RF/microwave CAD packages, including ADS and Super-Compact mentioned hereinabove, have built-in optimization routines. These built-in optimizers can be used in the step of optimizing 130.

Once optimized, the models can be used directly to generate an error array for correcting the measurement of a DUT. For example, the error array can be generated by taking raw measurements of the open, short, load and thru standards, while using the extracted models to generate the 'actual' or 'true' data. Using well-known techniques, the overall system error terms can then be computed. In another approach, the extracted models can be matched to the VNA system models, enabling extraction of calibration coefficients appropriate for the calibration kit definitions incorporated in the VNA. Then the actual measurements are compared to the kit extracted form of the model to generate the error correction arrays, again using well-known techniques and/or built-in functions of the VNA.

Alternatively, the test fixture may be de-embedded and calibrated measurement of the DUT performed. Furthermore, the models of the test fixture and the calibration standards can be separated from one another and used independently. In particular, once the optimized models of the calibration standards are available, the calibration standards can be used in the calibration of other test fixtures as 'known' standards using conventional calibration methods. Thus the method 100 of calibrating produces optimized models of the test fixture and standards that can be used subsequently in the step of creating 140 a calibration array. Alternatively, the S-parameters calculated using the optimized models could be used in the step of de-embedding 140' to mathematically de-embed or remove the effects of the test fixture from measured results for the DUT. One skilled in the art can readily create a calibration array given a VNA following guidelines from a manufacturer of the VNA. Likewise, one of ordinary skill in the art can de-embed the test fixture without undue experimentation.

As noted hereinabove, simple models of the test fixture and the calibration standards are preferred. The greater the complexity of a model, the more constituent elements or variables the model has. Having too many variables may not sufficiently constrain the optimization, which results in a model that may not have a smooth modeled response. For example, in addition to models of the test fixture and the calibration standards, a model of the test system including cabling between the test system and the test fixture can be used. On the other hand, missing or misplaced elements in the model can lead to an inability of finding an acceptable match between the modeled performance and the measured data. One skilled in the art is familiar with the trade-offs between model complexity and the likely smoothness of the modeled response. In short, the results obtained can only account for elements included in the models. Similarly, as one skilled in the art is aware, a large number of variables tends to increase the possibility that a given optimizer will fail to find a reasonably global optimum solution in a reasonable amount of time.

Furthermore, as noted hereinabove, it is preferable to constrain the model and the optimization of the model by incorporating a priori knowledge of the physical test fixture and the calibration standards. For example, consider a situation where it is known that a piece of transmission line in the test fixture is a 50 ohm microstrip transmission line. As discussed hereinabove, it recommended that the test fixture model should include an element corresponding to the length of microstrip transmission line. In addition, it is recommended that the optimizer be constrained to assign values near 50 ohms to the modeled element corresponding to the microstrip transmission line during optimization. While it is not required to constrain the optimization in this way, the constrained optimization is much more likely to yield acceptable results and avoid absurd or physically impossible values for model elements.

An example application of method 100 of calibrating was performed using the test fixture 200 illustrated in FIG. 2A as the input portion and the output portion of a two-port test fixture. The calibration was an SOLT calibration and used a short, open, load and thru having unknown S-parameters. The model 210 and the models 230, 240, 250 and 260 illustrated in FIG. 2B, and FIGS. 3A–3D, respectively, were selected 110. The step of measuring 120 was carried out over a frequency range of 10 MHz to 6 GHz while the step of optimizing 130 was conducted using a frequency range of 10 MHz to 3 GHz with a corresponding subset of the measured data. The step of optimizing 130 yielded a set of optimized element values for the elements of the test fixture model 210. The optimized test fixture model element values that resulted are listed in Table 1. Table 2 lists non-optimized additional parameters used in the test fixture model 210 to define the substrate of the test fixture model 210.

TABLE 1

Element values for example model illustrated in FIGS. 2B resulting from the step of optimizing 130 applied to an example set of calibration standards and an example test fixture 200.

| Parameter Name | Optimized Value | Constraint Range |
| --- | --- | --- |
| Z1 | 53.48833 ohms | 40 to 60 ohms |
| E1 | 10.77468 degrees | 1 to 180 degrees |
| W1 | 4.01575 mm | 1.27 to 5.08 mm |
| L1 | 5.62541 mm | 2.54 to 12.7 mm |
| W2 | 3.30197 mm | 1.27 to 7.62 mm |
| L2 | 34.6567 mm | 12.7 to 50.8 mm |
| LSMA1 | 0.7806023 nH | 0.001 to 2 nH |
| CSMA1 | 0.3184624 pF | 0.001 to 1 pF |
| ER1 | 3.77860 | 3.5 to 5 |
| TD1 | 0.02347731 | 0.001 to 0.04 |

TABLE 2

Additional parameters used with the example test fixture 200 which are not optimized.

| Parameter Name | Value |
| --- | --- |
| H | 1.4986 mm |
| Mur | 1 |
| Cond | 1 e + 50 |
| Hu | 99.06 e + 34 mm |
| T | 25.4 e − 3 mm |
| Rough | 0 |

The optimized test fixture model 210 parameters Z1 and E1 are the impedance in ohms and electrical length (in degrees at 1 GHz), respectively, of the coaxial transmission line 212. The optimized test fixture model 210 parameters W1 and L1 are the width and length, respectively, of the first section 216 of transmission line while W2 and L2 are the width and length, respectively, of the second section 217 of transmission line. The optimized inductance 214 value is given in Table 1 as LSMA1 and the optimized capacitance 215 value is given by CSMA1 in Table 1. The optimized parameters ER1 and TD1 in Table 1 correspond to the substrate dielectric constant and the dielectric loss tangent, respectively.

The parameters in Table 2 define the substrate and were not optimized in the step of optimizing 130. The parameter H is a thickness of the substrate. Parameters Mur is the relative permeability of the substrate while Cond is the conductivity of the metal used to define the transmission line sections 216, 217. The parameters Hu and T refer to the height of an upper ground plane (in this case, a very large number representing no upper ground plane) and the thickness of the conductor material, respectively. The parameter Rough defines the surface roughness of the substrate. Although these parameters were not optimized in the step of optimizing 130, these parameters could have been optimized if desired. The parameters in Table 2 are determined by the choice of a commercially available printed circuit board material used in the test fixture 200. Once optimized 130, the simulated performance of the models of the example was found to closely match the measured 120 performance of the test fixture plus the calibration standards over the entire frequency range.

Preferably, the VNA is calibrated using conventional calibration standards and following a calibration procedure recommended by the manufacturer of the VNA prior to employing the method 100. Calibrating the VNA in this manner effectively removes the effects of the VNA and any cabling between the VNA and the test fixture from consideration during calibration according to method 100 of the present invention. While not necessary, a conventional calibration preceding the use of method 100 tends to improve the results obtained. In part, this calibration eliminates a need to include the VNA and interface cabling in the models used in the method 100.

Figure 4:
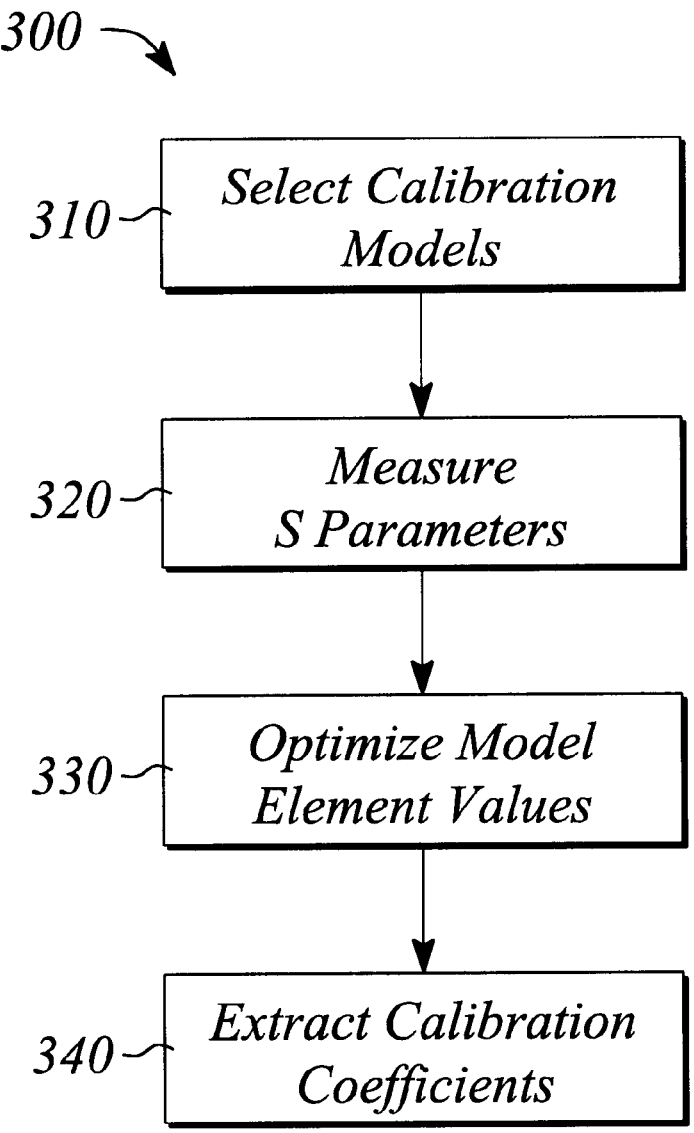
FIG. 4 illustrates a flow chart of a method of determining calibration coefficients of the present invention.

In another aspect of the invention, a method 300 of determining calibration coefficients for in-fixture calibration standards is provided. A flow chart of the method 300 of determining calibration coefficients is illustrated in FIG. 4. Advantageously, the method of determining calibration coefficients of the present invention may use unknown calibration standards that are adapted for use in a test fixture. Like the method 100, the method 300 of determining does not rely on the use of precision calibration standards with accurately known S-parameters.

The method 300 of determining calibration coefficients comprises the step of selecting 310 a model for each of the unknown calibration standards and a model for the test fixture. The method 300 of determining further comprises the step of measuring 320 the S-parameters of each combination of the test fixture and a different one of the unknown calibration standards over a frequency band of interest. The method 300 of determining further comprises the step of optimizing 330 element values of the constituent elements of the model for the test fixture and the models for the calibration standards. The method 300 of determining further comprises the step of extracting 340 the calibration coefficients for the standard from the optimized model of the standard. The steps of selecting 310, measuring 320, and optimizing 330, are essentially the same as the steps of selecting 110, measuring 120, and optimizing 130 of the method 100 of calibrating described hereinabove. The step of extracting 340 the calibration coefficients depends on definitions of the calibration coefficients needed for a given vector network analyzer. Given a specific network analyzer and the optimized model parameters of the calibration standards produced by the step of optimizing 330 of the method 300, one skilled in the art would be able to perform the step of extracting 340 without undue experimentation. For example, a method of performing the step of extracting 340 for the case of an Agilent 8510C Vector Network Analyzer (VNA) is provided in the application note PN 8510-5A referenced and incorporated by reference hereinabove.

The model of the calibration standard used in this method 300 may not match the structure of the model for a calibration standard built into the VNA. An equivalent VNA model may be extracted from a derived calibration standard model used in this method 300 by creating a simulation of the derived calibration standard model with the derived values fixed, and a VNA model with the VNA model elements optimizable, and optimizing the VNA model to match the derived calibration standard model. Of course, in some instances, the VNA model may not be sufficiently complex to allow an adequate match to the calibration standard model of this method 300. In this case, the VNA model can be optimized with different values over different frequency segments to get better agreement. Alternatively, the VNA model types built into the VNA may be extended to include characterized devices, in which case the characterized values may be derived by simulation of the S-parameters of the calibration standard model of this method 300 over the frequency range of interest, and using the results as the characterized values in the VNA.

Preferably, the VNA is calibrated using conventional calibration standards and following a calibration procedure recommended by the manufacturer of the VNA prior to employing the method 300. As with method 100, calibrating the VNA in this manner effectively removes the effects of the VNA and any cabling between the VNA and the test fixture from consideration during calibration according to method 300 of the present invention. While not necessary, a conventional calibration preceding the use of method 300 tends to improve the results obtained.

In another aspect of the present invention, a system 400 for calibrating test equipment using unknown calibration standards is provided. Preferably, the system employs the method 100 of the present invention. The system 400 provides calibration for testing, including in-fixture testing, of a device under test (DUT) and is applicable to any test equipment that employs a standards-based calibration, including but not limited to scalar network analyzers, vector network analyzers (VNAs), impedance analyzers, power meters, and spectrum analyzers. In particular, the system 400 for calibrating is applicable to a vector network analyzer.

Figure 5:
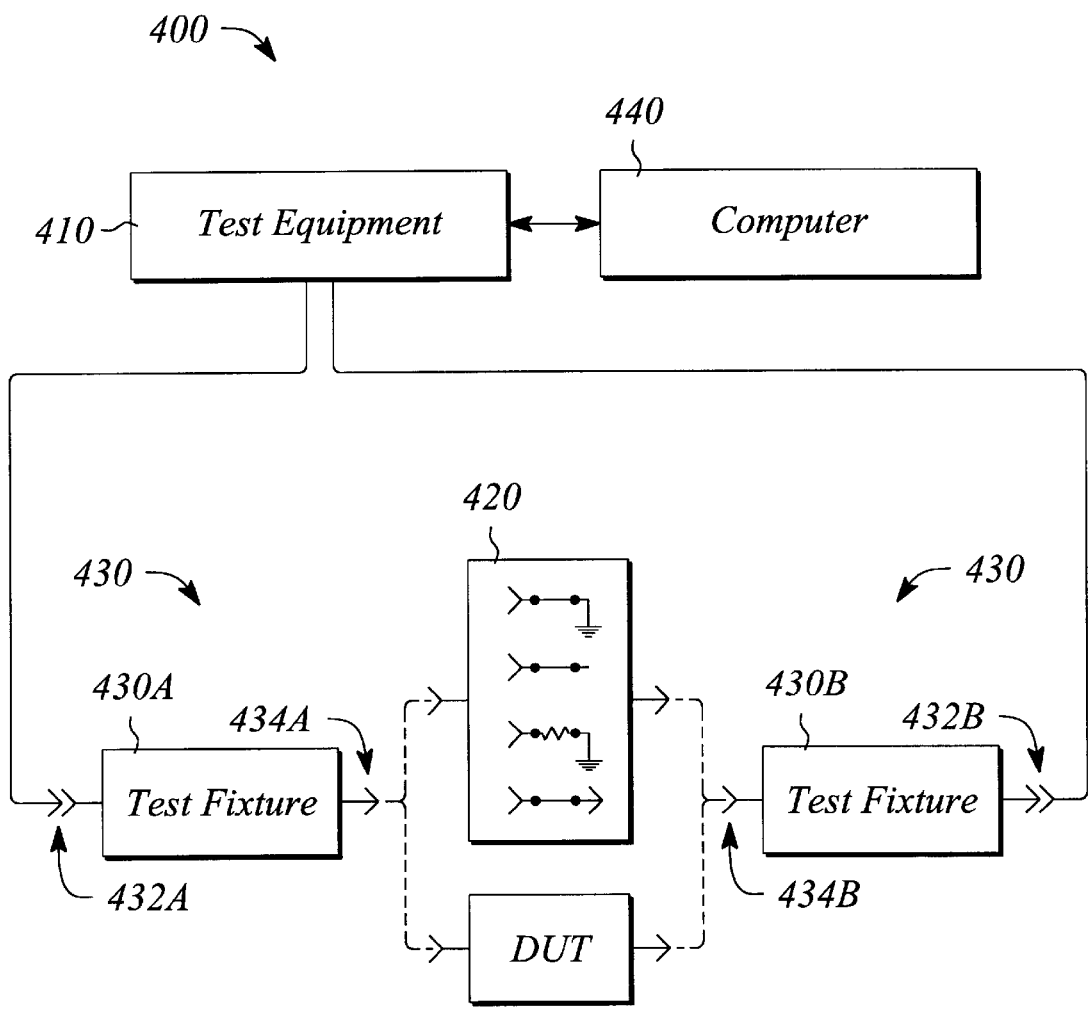
FIG. 5 illustrates a block diagram of a system for calibrating test equipment using unknown standards according to the present invention.

FIG. 5 illustrates a block diagram of the system 400 for calibrating of the present invention. The system 400 comprises a set 420 of calibration standards, wherein at least one calibration standard of the set is an unknown standard. The set of calibration standards is chosen to be appropriate for a calibration type associated with the test equipment. For example, if the test equipment 410 is a vector network analyzer and the calibration type is an SOLT calibration, the set 420 of standards would comprise a short, an open, a load, and a thru. By way of example, an SOLT calibration set 420 is illustrated in FIG. 5.

In one embodiment, the system 400 further comprises test equipment 410 and in another embodiment, may further comprise a test fixture 430 adapted for the device under test (DUT). The test fixture 430 provides an interface between the test equipment 410 and the DUT. As illustrated in FIG. 5, the test fixture 430 comprises an input portion 430A and an output portion 430B. Some test fixtures 430 may only have one of an input portion 430A or output portion 430B depending on the particular DUT and on the test equipment. Characteristics of the test fixture 430 have already been described in more detail hereinabove.

The system 400 further comprises computer 440 or an equivalent processor/controller apparatus. The computer 440 may comprise a stand-alone general-purpose processor or may be a specialized processor built into the test equipment 410. The computer 440 receives data from the test equipment 410 and processes the data. In addition, the computer 440 provides a modeling environment for modeling the standards 420 and performing model optimization according to the method 100 of the present invention. The modeling environment and model optimization have already been described in more detail hereinabove.

The test equipment 410 may be attached to the test fixture 430 at one or more test equipment ports 432A, 432B of the input and output portions 430A, 430B of the test fixture 430. During calibration of the test equipment 410 using the system 400, the unknown standards 420 are each alternately attached and removed from DUT ports 434A, 434B of the input and output portions 430A, 430B of the test fixture 430. Once calibration is complete, the DUT is attached to the DUT ports 434A, 434B of the test fixture. An example of one half (e.g. the input portion 430A or output portion 430B) of such a test fixture is illustrated in FIG. 2A.

The system 400 employs the method 100 for calibrating of the present invention. In particular, the system measures parameters of the unknown standards 420 and then optimizes element values of the models of the standards according to the method 100. The optimized models then are used to calibrate the test equipment, as described hereinabove. The method is implemented as a computer program stored in memory of and is executed by the computer 440. Given the discussion hereinabove, one of ordinary skill in the art can readily construct just such a computer program using a standard computer programming language without undue experimentation.

Figure 6:
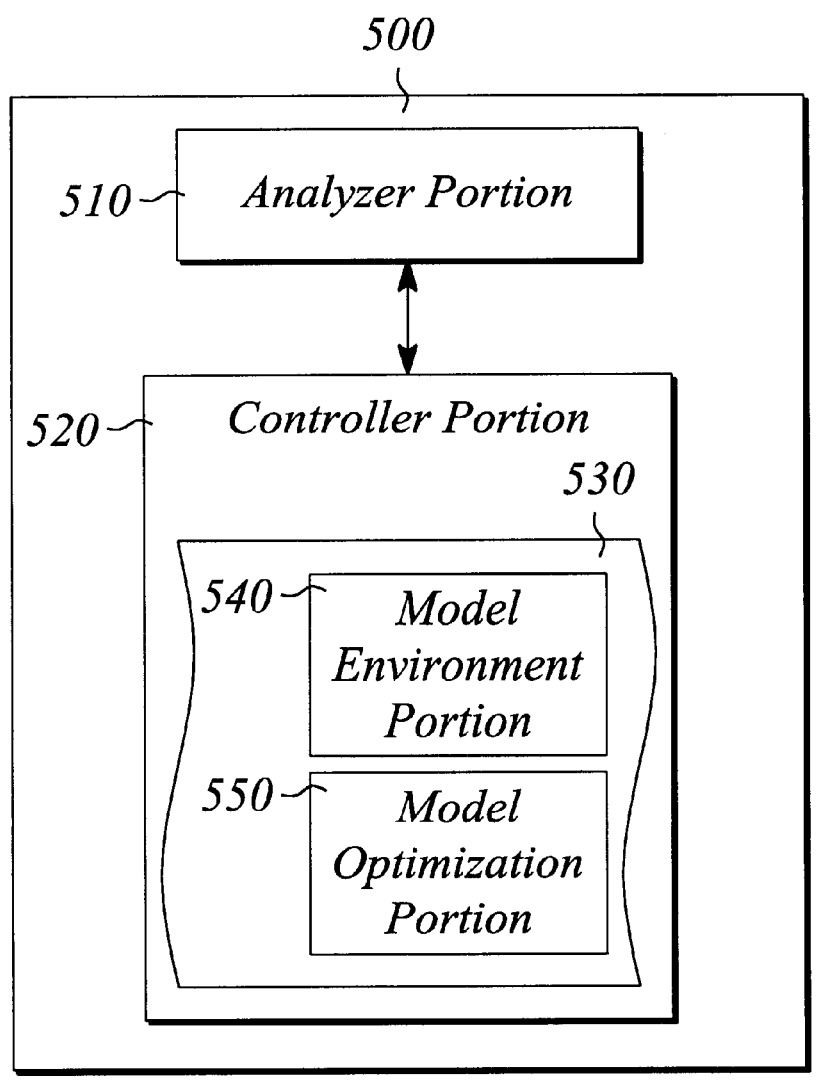
FIG. 6 illustrates a block diagram of a vector network analyzer having standards-based calibration according to the present invention.

In still another aspect of the invention, a vector network analyzer 500 having a standards-based calibration is illustrated in FIG. 6. The vector network analyzer 500 comprises an analyzer portion 510 having an analyzer port, and a controller portion 520 that controls the operation of the analyzer portion 510. The controller portion 520 comprises and implements a calibration computer program 530. The computer program 530 comprises a modeling environment portion 540 and a model optimization portion 550. The modeling environment portion 540 comprises a computer model for each unknown calibration standard from a set of calibration standards used in the standards-based calibration, wherein the set comprises at least one unknown standard. The modeling environment further comprises simulated data for each of the unknown calibration standard models. The model optimization portion 550 comprises an optimized model for each of the unknown calibration standard models. The optimized model comprises an adjustment that is based on an agreement between the simulated data for the computer model and respective actual measurement data taken by the analyzer portion 510 at the analyzer port.

In one embodiment, the vector network analyzer 500 is associated with a test fixture (not illustrated). The test fixture has a test port connected to the analyzer port of the analyzer portion 510 and a DUT port that is adapted for connection to a device under test (DUT) or to each standard of the set of calibration standards. In this embodiment, the modeling environment portion 540 further comprises a computer model for the test fixture and stimulated data for different combinations of the test fixture model and each calibration standard of the set. The model optimization portion 550 further comprises an optimized model for the test fixture model. The optimized model comprises an adjustment that is based on an agreement between the simulated data for the different combinations and respective actual measurement data for each of the calibration standards of the set taken by the analyzer portion 510 at the test fixture DUT port.

The vector network analyzer 500 of the present invention may use any set of calibration standards, where at least one standard is unknown. In one embodiment, the calibration standard set is selected from one or more of short-open-load-thru (SOLT), thru-reflect-line (TRL), and line-reflect-match (LRM), as described further above.

Each computer model in the modeling environment portion 540 comprises one or more constituent elements with at least one unknown element value. The constituent element represents a discrete component or a distributed component, as was described further above. The simulated data for the computer models are simulated one or both of manually and automatically. Automatic simulation comprises using general-purpose microwave and RF modeling computer aided design (CAD) tools that support constituent elements of the model. Manual simulation comprises using RF and microwave circuit analysis and design formulas.

The adjustment in the respective optimized model in the model optimization portion 550 is an adjustment to the respective unknown element value. The model optimization portion 550 makes the respective adjustment until the simulated data for the respective unknown calibration standard model agrees with the respective actual measurements. The computer program 530 implements one or more optimization methodologies selected from random step, conjugate gradient, Powel's method, and genetic algorithm in the model optimization portion 550 to produce the optimized model.

Thus, there has been described a novel method 100 and system 400 for calibrating test equipment, including but not limited to scalar network analyzers, vector network analyzers (VNAs), impedance analyzers, power meters, and spectrum analyzers, that employs standards-based calibration with calibration standards having unknown characteristics. Moreover, a method 300 of determining calibration coefficients for unknown calibration standards has been described as well as a novel vector network analyzer 500 having standards-based calibration that uses unknown standards. It should be understood that the above-described embodiments are merely illustrative of the some of the many specific embodiments that represent the principles of the present invention. Clearly, those skilled in the art can readily devise numerous other arrangements without departing from the scope of the present invention as defined by the following claims.

What is claimed is:

1. A method of calibrating a test system for testing a device under test, the method comprising the steps of:

selecting respective models for a set of calibration standards, each of the models defining a constituent element for which element values must be specified to fully characterize the associated calibration standard, at least one of the element values for at least one of the calibration standards being initially unknown;

performing measurements using each of the calibration standards so that the measurements collectively are sufficient to determine the initially unknown element value;

optimizing the respective calibration standard models by adjusting the unknown element value of the respective constituent elements in each model such that performance data for the calibration standard models agree with the respective measured performance data; and calibrating the test system as a function of the measurements and the optimized calibration standard models.

2. The method as recited in claim 1, wherein in the performing step, each calibration standard is attached in turn to the test system for the measurements.

3. The method as recited in claim 1, wherein in the performing step, each calibration standard is attached in turn to the test system via a test fixture for the measurements.

4. The method as recited in claim 3, wherein the text fixture has an associated fixture model having an associated constituent element for which fixture element values must be specified to fully characterize the test fixture, at least one of the fixture element values being initially unknown, the measurements obtained in the performing step being sufficient to determine the initially unknown fixture value.

5. The method as recited in claim 1, further comprising the step of computing a calibration coefficient for the initially unknown element value from the measurements.

6. A method of calibrating a test system according to a standards-based calibration comprising the steps of:

measuring performance data of a set of calibration standards using the test system, wherein at least one of the calibration standards is an unknown standard;

selecting a computer model for the unknown calibration standard, the calibration standard model having a constituent element that has at least one unknown element value; and optimizing the calibration standard model by adjusting the unknown element value of the constituent element such that performance data for the calibration standard model agrees with the measured performance data for the unknown calibration standard, wherein the optimized model is used along with the measured performance data of the set of calibration standards to calibrate the test system.

7. The method of claim 6, wherein in the step of selecting, the constituent element represents one of a discrete component or a distributed component.

8. The method of claim 6, wherein the test system comprises a network analyzer and the performance data comprises S-parameters.

9. The method of claim 6, wherein the step of optimizing comprises the steps of:

simulating performance of the unknown calibration standard to produce simulated performance data for the unknown calibration standard;

comparing the simulated performance data to the performance data measured for the unknown calibration standard; and adjusting the unknown element value of the constituent element according to an optimization methodology until the simulated performance data and the measured performance data approach agreement according to a predefined metric.

10. The method of claim 9, wherein the predefined metric gauges a quality of the agreement between the simulated data and the measured data of the unknown calibration standard.

11. The method of claim 9, wherein the predefined metric is one of a minimization metric or a maximization metric.

12. The method of claim 11, wherein the minimization metric comprises a sum of a square of a difference between the measured data and the simulated data at a number of frequency points within a frequency range.

13. The method of claim 11, wherein the test, system comprises a network analyzer and the performance data comprises S-parameters and, wherein an SOLT calibration set is used and all of the calibration standards of the set are unknown, and wherein the minimization metric comprises a magnitude of a difference between the measured S-parameter data and the simulated S-parameter data for a reflection S-parameter of a load unknown calibration standard and a reflection S-parameter of a thru unknown calibration standard, and comprises a difference between unity and a ratio of the measured S-parameter data and the simulated S-parameter data for a reflection S-parameter of an open unknown calibration standard, for a reflection S-parameter of a short unknown calibration standard, and for a transmission S-parameter of the thru calibration standard, the minimization metric being applied at a number of frequency points within a frequency range.

14. The method of claim 9, wherein in the step of optimizing, the simulated performance data are simulated one or both of manually and automatically, wherein automatic simulation comprises using general-purpose microwave and RF modeling computer aided design (CAD) tools that support the constituent element of the model, and wherein manual simulation comprises using RF and microwave circuit analysis and design formulas.

15. The method of claim 6, wherein the step of optimizing comprises using one or more optimization methods selected from random step, conjugate gradient, Powel's method, and genetic algorithm optimizations.

16. The method of claim 6, wherein the steps of selecting and optimizing both comprise incorporating a prior knowledge of the unknown calibration standard to constrain the computer model.

17. The method of claim 6, wherein all of the calibration standards of the set are unknown.

18. The method of claim 6, further comprising the step of computing a calibration coefficient for the unknown calibration standard from the optimized model.

19. The method of claim 6, wherein the test system has an associated test fixture that connects to a device under test (DUT) to be tested, such that during the step of measuring, each calibration standard of the set is individually attached to a DUT port of the test fixture to obtain the measured performance data, and wherein the step of selecting the computer model for the unknown calibration standard further comprises selecting a computer model for the test fixture, the test fixture model having an associated constituent element with at least one unknown element value, and wherein the step of optimizing the calibration standard model further comprises optimizing the test fixture model.

20. The method of claim 6, further comprising the step of creating a calibration array for the test system.

21. A method of calibrating a test system having in-fixture testing of a device under test (DUT) using a standards-based calibration comprising the steps of:

selecting a computer model of a test fixture that is used in the in-fixture testing, and selecting a computer model of each unknown calibration standard of a set of unknown calibration standards, the respective models comprising respective constituent elements, each having at least one unknown element value;

measuring performance data of different combinations of the test fixture and each unknown calibration standard of the set with the test system; and optimizing the respective models by adjusting the unknown element value of the respective constituent elements in each model, wherein the optimized models are used with the measured performance data of the combinations to apply an error correction to the test system.

22. The method of claim 21, wherein the test system comprises a network analyzer and the performance data comprises S-parameters.

23. The method of claim 22, wherein the standards-based calibration is selected from one or more of short-open-load-thru (SOLT), thru-reflect-line (TRL), and line-reflect-match (LRM) calibration standard sets.

24. The method of claim 21, wherein in the step of selecting, the constituent elements of the respective models represent a discrete component or a distributed component.

25. The method of claim 23, wherein the calibration standard set is SOLT, and the step of measuring comprises the steps of taking separate measurements of a reflection S-parameter for each combination of a short unknown calibration standard connected to an input portion of the test fixture, an open unknown calibration standard connected to the input portion of the test fixture, and a load unknown calibration standard connected to the input portion of the test fixture; taking separate measurements of the reflection S-parameter for the same unknown calibration standards each connected to an output portion of the test fixture; and taking a separate measurement of the reflection S-parameter for a thru unknown calibration standard connected between the input portion and the output portion of the test fixture.

26. The method of claim 21, wherein the step of measuring comprises taking a number of independent measurements for each combination of the test fixture and a different one of the unknown calibration standards at a number of frequency points within a frequency range.

27. The method of claim 26, wherein the number of frequency points is greater than a number of the constituent elements divided by the number of independent measurements.

28. The method of claim 21, wherein the step of optimizing comprises the steps of:
  simulating performance of the test fixture in combination with each unknown calibration standard of the set using the test fixture model in combination with each different unknown calibration standard model to produce simulated performance data for each combination;
  comparing the simulated performance data for each combination to the performance data measured for the respective combinations of the test fixture and the unknown calibration standard; and
  adjusting the unknown element values of the respective constituent elements of each model according to an optimization methodology until the respective performance data approach agreement according to a predefined metric.

29. The method of claim 28, wherein the steps of simulating, comparing and adjusting provide simultaneous simulation and optimization of the test fixture in combination with each unknown calibration standard.

30. The method of claim 28, wherein the predefined metric gauges a quality of the agreement between the simulated data and the measured data of each combination of the test fixture and the unknown calibration standard.

31. The method of claim 28, wherein the predefined metric is one of a minimization metric or a maximization metric.

32. The method of claim 31, wherein the minimization metric comprises a sum of a square of a difference between the measured data and the simulated data at a number of frequency points within a frequency range.

33. The method of claim 31, wherein the test system comprises a network analyzer and the performance data comprises S-parameters and, wherein the minimization metric comprises a magnitude of a difference between the measured S-parameter data and the simulated S-parameter data for a reflection S-parameter of a load unknown calibration standard and a reflection S-parameter of a thru unknown calibration standard, and comprises a difference between unity and a ratio of the measured S-parameter data and the simulated S-parameter data for a reflection S-parameter of an open unknown calibration standard, for a reflection S-parameter of a short unknown calibration standard, and for a transmission S-parameter of the runt unknown calibration standard, the minimization metric being applied at a number of frequency points within a frequency range.

34. The method of claim 28, wherein in the step of optimizing, the simulated data are simulated one or both of manually and automatically, wherein automatic simulation comprises using general-purpose microwave and RF modeling computer aided design (CAD) tools that support all of the constituent elements of the respective models, and wherein manual simulation comprises using RF and microwave circuit analysis and design formulas.

35. The method of claim 28, wherein the step of optimizing comprises using one or more optimization methods selected from random step, conjugate gradient, Powel's method, and genetic algorithm optimizations.

36. The method of claim 21, wherein the steps of selecting and optimizing both comprise incorporating a priori knowledge of the test fixture and the unknown calibration standard to constrain the respective models.

37. The method of claim 21, further comprising the step of computing a calibration coefficient for each unknown calibration standard from the optimized model of the respective unknown calibration standard.

38. The method of claim 21, further comprising the step of performing a calibrated measurement of the device under test with the test system, wherein the step of performing comprises:
  measuring performance data for the device under test connected to the test fixture; and
  de-embedding an affect that the test fixture has on the measured performance data for the device under test using the optimized test fixture model.

39. The method of claim 21, further comprising the step of creating a calibration array for the test system.

40. A method of determining a calibration coefficient for an unknown calibration standard from a set of calibration standards used for standards-based calibration of a test system, where the set comprises at least one unknown calibration standard, the method comprising the steps of:
  selecting a computer model of the unknown calibration standard, the calibration standard model having a constituent element with at least one unknown element value;
  measuring performance data of each different calibration standard of the set within a frequency range;
  optimizing the computer model of the unknown calibration standard by adjusting the unknown element value of the constituent element; and
  extracting a calibration coefficient for the unknown calibration standard from the optimized model.

41. The method of claim 40, wherein the test system is a vector network analyzer, and wherein in the step of extracting, the calibration coefficient is dependent on the vector network analyzer to be calibrated.

42. The method of claim 40, wherein the test system uses a test fixture to test a device under test, the test fixture having an unknown parameter, and wherein the set of calibration standards are used to calibrate the test fixture, such that the method further comprises the steps of:
  selecting a computer model of the test fixture, the test fixture model having a respective constituent element with at least one respective unknown element value;
  measuring performance data of different combinations of the test fixture and each calibration standard of the set within the frequency range; and
  optimizing the test fixture model by adjusting the respective unknown element value of the respective constituent element of the test fixture model.

43. A system for calibrating test equipment using a standards-based calibration comprising:
  a set of calibration standards, at least one standard of the set being an unknown calibration standard, each calibration standard of the set being temporarily interfaced to the test equipment for respective measurements; and a computer interfaced with the test equipment, the computer implementing a computer program that provides a modeling environment and a model optimization, the modeling environment comprising a computer model for each unknown calibration standard, and simulated data for each of the computer models, and the model optimization comprising an optimized model for each of the computer models, each of the optimized models being a function of the respective measurements and the simulated data for the respective model.

44. The system of claim 43, wherein each computer model has a constituent element with at least one respective unknown element value, and wherein the optimized model for each unknown standard computer model has an adjustment to the respective unknown element value, such that the simulated data for each unknown calibration standard model agrees with the respective measurements.

45. The system of claim 44, wherein the constituent element of the respective computer models represent a discrete component or a distributed component.

46. The system of claim 43, wherein the computer program implements one or more optimization methodologies selected from random step, conjugate gradient, Powel's method, and genetic algorithm for the model optimization.

47. The system of claim 43, wherein a test fixture is connected between the test equipment and each respective calibration standard for the respective measurements, and wherein the modeling environment further comprises a computer model for the test fixture, and simulated data for each different combination of the test fixture and a different one of the calibration standards, and wherein the model optimization further comprises an optimized model for the test fixture model, the optimized test fixture model being a function of the simulated data for the different combinations and the respective measured data for the different combinations.

48. The system of claim 47, wherein the test fixture model has a constituent element with at least one unknown element value, and the optimized test fixture model has an adjustment to the unknown element value, such that the simulated data for each combination agrees with the respective measurements.

49. The system of claim 43, wherein the test equipment is a vector network analyzer, and the measurements are S-parameters measurements.

50. A vector network analyzer having a standards-based calibration using a set of calibration standards where at least one standard is unknown, the analyzer comprising:

a vector network analyzer portion having an analyzer port; and a controller that controls the operation of the analyzer portion, the controller implementing a calibration computer program that comprises a modeling environment portion and a model optimization portion, the modeling environment portion comprising a computer model for each unknown calibration standard of the set of calibration standards, and simulated data for each of the computer models, and the model optimization portion comprising an optimized model for each of the computer models, each optimized model comprising an adjustment that is a function of the simulated data for the respective model and actual measurement data of the respective unknown calibration standard taken by the analyzer portion at the analyzer port.

51. The vector network analyzer of claim 50, further comprising a test fixture having a test port that connects to the analyzer port and a DUT port adapted to connect to a device under test (DUT) or to each calibration standard of the set for respective measurements, wherein the modeling environment portion further comprises a computer model for the test fixture, and simulated data for combinations of the test fixture model and each different unknown standard model, and wherein the model optimization portion further comprises an optimized model for the test fixture model, the optimized test fixture model comprising an adjustment that is a function of the simulated data for the respective model combinations and respective actual measurement data of each unknown calibration standard taken by the analyzer portion at the test fixture DUT port.

52. The vector network analyzer of claim 50, wherein the set of calibration standards is selected from one or more of short-open-load-thru (SOLT), thru-reflect-line (TRL), and line-reflect-match (LRM).

53. The vector network analyzer of claim 50, wherein each computer model has a constituent element with at least one respective unknown element value, and wherein the adjustment in the respective optimized model is an adjustment to the respective unknown element value, such that the simulated data for each unknown calibration standard model agrees with the respective actual measurements.

54. The vector network analyzer of claim 53, wherein the respective constituent elements represent a discrete component or a distributed component.

55. The vector network analyzer of claim 50, wherein the computer program implements one or more optimization methodologies selected from random step, conjugate gradient, Powel's method, and genetic algorithm for the model optimization portion.

* * * * *